United States Patent
Wang

(10) Patent No.: US 11,583,793 B2
(45) Date of Patent: Feb. 21, 2023

(54) GAS TRAP SYSTEM HAVING A CONICAL INLET CONDENSATION REGION

(71) Applicant: UTICA LEASECO, LLC, Rochester Hills, MI (US)

(72) Inventor: Chaowei Wang, San Diego, CA (US)

(73) Assignee: UTICA LEASECO, LLC, Rochester Hills, MI (US)

( * ) Notice: Subject to any disclaimer, the term of this patent is extended or adjusted under 35 U.S.C. 154(b) by 599 days.

(21) Appl. No.: 16/595,939

(22) Filed: Oct. 8, 2019

(65) Prior Publication Data

US 2021/0101099 A1  Apr. 8, 2021

(51) Int. Cl.
| | | |
|---|---|---|
| *B01D 8/00* | (2006.01) | |
| *B01D 35/30* | (2006.01) | |
| *B01D 53/00* | (2006.01) | |
| *C23C 16/44* | (2006.01) | |

(52) U.S. Cl.
CPC ............... *B01D 35/30* (2013.01); *B01D 8/00* (2013.01); *B01D 53/002* (2013.01); *C23C 16/4412* (2013.01)

(58) Field of Classification Search
CPC ........ B01D 8/00; B01D 35/30; B01D 53/002; B01D 53/1418; B01D 53/1431; B01D 53/04; B01D 2257/55; B01D 2257/93; B01D 2258/0216; C23C 16/06; C23C 16/18; C23C 16/4412; C30B 25/14; H01L 21/00271; H01L 21/0228
See application file for complete search history.

(56) References Cited

U.S. PATENT DOCUMENTS

| | | | |
|---|---|---|---|
| 4,506,513 A | 3/1985 | Max | |
| 5,303,558 A | 4/1994 | Caton et al. | |
| 5,411,707 A | 5/1995 | Hiatt | |
| 6,488,745 B2 | 12/2002 | Gu | |
| 6,908,499 B2 * | 6/2005 | Lin | C23C 16/4412 55/DIG. 15 |
| 6,966,936 B2 | 11/2005 | Yamasaki et al. | |
| 7,044,997 B2 * | 5/2006 | Mardian | B01D 5/0006 96/417 |
| 7,488,374 B2 | 2/2009 | Komatsu | |
| 2004/0069224 A1 * | 4/2004 | Lin | C23C 16/4412 118/715 |

(Continued)

OTHER PUBLICATIONS

International Search Report and Written Opinion issued in PCT/US2020/054591, dated Jan. 13, 2021, pp. 1-5.

*Primary Examiner* — Jonathan Miller
(74) *Attorney, Agent, or Firm* — Arentfox Schiff LLP

(57) ABSTRACT

A gas trap system for metal organic chemical vapor deposition (MOCVD) exhaust abatement operations is provided. The gas trap system may include a housing including an inlet configured to receive exhaust gas and an outlet. The gas trap system may also include a conical inlet shield positioned within the housing. The conical inlet shield may form a first path between the housing and the conical inlet shield, wherein the first path receives the exhaust gas from the inlet. The conical inlet shield may also cool the exhaust gas and cause the exhaust gas to be uniformly distributed in the first path. The gas trap system may also include a filter configured to receive the exhaust gas from the first path and to filter the exhaust gas, wherein the filtered gas exhaust is provided to the outlet.

20 Claims, 10 Drawing Sheets

(56) References Cited

U.S. PATENT DOCUMENTS

2005/0061150 A1\* 3/2005 Mardian .............. B01D 5/0006
                                                    55/434.2
2015/0107771 A1   4/2015 Kobayashi et al.

\* cited by examiner

GAS TRAP SYSTEM HAVING A CONICAL INLET CONDENSATION REGION

BACKGROUND

Technical Field

The present disclosure relates generally to a gas trap system, and more particularly, to a gas trap system having a conical inlet condensation region.

INTRODUCTION

When using metal-organic chemical vapor deposition (MOCVD) techniques, exhaust gas is treated to remove toxic materials, a process generally referred to as effluent abatement where there is a reduction or elimination of the toxic materials being discharged. For gallium-arsenide (GaAs) MOCVD operations, these toxic materials may include species that contain arsenic (different forms of arsenic such as arsine gas (AsH3) and arsenic vapors) and some amounts of gallium. During the effluent abatement process, in some implementations, exhaust from the MOCVD operation may be first passed through a cold trap to condense and collect some of the toxic materials. The output from the cold trap may then go through a pump to increase the pressure and then possibly additional cold traps to ensure that all condensable material is collected and removed. Subsequently, a scrubber (e.g., wet or dry scrubber) may be used to absorb any remaining arsine gas or arsenic left in the exhaust gas. Any hydrogen left in the gas may then burned to finalize the effluent abatement process.

Some cold trap systems (or gas trap systems) may include paths and/or components (e.g., shields) that cause flow recirculation, which may result in particle condensation and accumulation along the paths, non-uniform temperatures along the paths, and non-uniform use of filters within the cold trap systems. Accordingly, there exists a need for further improvements to gas trap systems.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect, a gas trap system for metal organic chemical vapor deposition (MOCVD) exhaust abatement operations is provided. The gas trap system may include a housing having an inlet configured to receive exhaust gas and an outlet. The gas trap system may also include a conical inlet shield positioned within the housing and configured to form a first path between the housing and the conical inlet shield, wherein the first path receives the exhaust gas from the inlet, cool the exhaust gas, and cause the exhaust gas to be uniformly distributed in the first path. The gas trap system may also include a filter configured to receive the exhaust gas from the first path and to filter the exhaust gas, wherein the filtered gas exhaust is provided to the outlet.

In another aspect, a MOCVD exhaust abatement processing system is provided. The MOCVD exhaust abatement processing system may include one or more gas trap systems each having a housing. The housing may include an inlet configured to receive exhaust gas from one or more upstream components, and an outlet configured to provide the exhaust gas to one or more downstream components. The MOCVD exhaust abatement processing system may also include a conical inlet shield positioned within the housing. The conical inlet shield may be configured to form a first path between the housing and the conical inlet shield, wherein the first path receives the exhaust gas from the inlet, cool the exhaust gas, and cause the exhaust gas to be uniformly distributed in the first path. The MOCVD exhaust abatement processing system may also include a filter configured to receive the exhaust gas from the first path and to filter the exhaust gas, wherein the filtered gas exhaust is provided to the outlet.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Some gas trap systems in metal-organic chemical vapor deposition (MOCVD) exhaust abatement processing systems including configurations that use an inlet followed by a shield which may cause flow recirculation, particle condensation and agglomeration at several locations in the flow, along with non-uniform temperatures, and lower utilization of a filter. Further, these configurations may result in the filter becoming clogged, and have a lower capture efficiency and a short mean time between maintenance (MTBM).

The present disclosure provides a gas trap system having a conical inlet shield configured to receive exhaust gas from an inlet on top of a housing of the gas trap system and an outlet of the housing located below the inlet. The gas trap system of the present disclosure may minimize recirculation of the exhaust gas within the system and provide uniform distribution of the exhaust gas to a filter. Further, the gas trap system of the present disclosure may provide temperature control to extend a system life of the gas trap system and reduce mean time between maintenance (MTBM).

Turning now to the figures, examples of systems are described herein. It is to be understood that system components in the figures may not be drawn to scale and are instead drawn for illustrative purposes.

Figure 1:
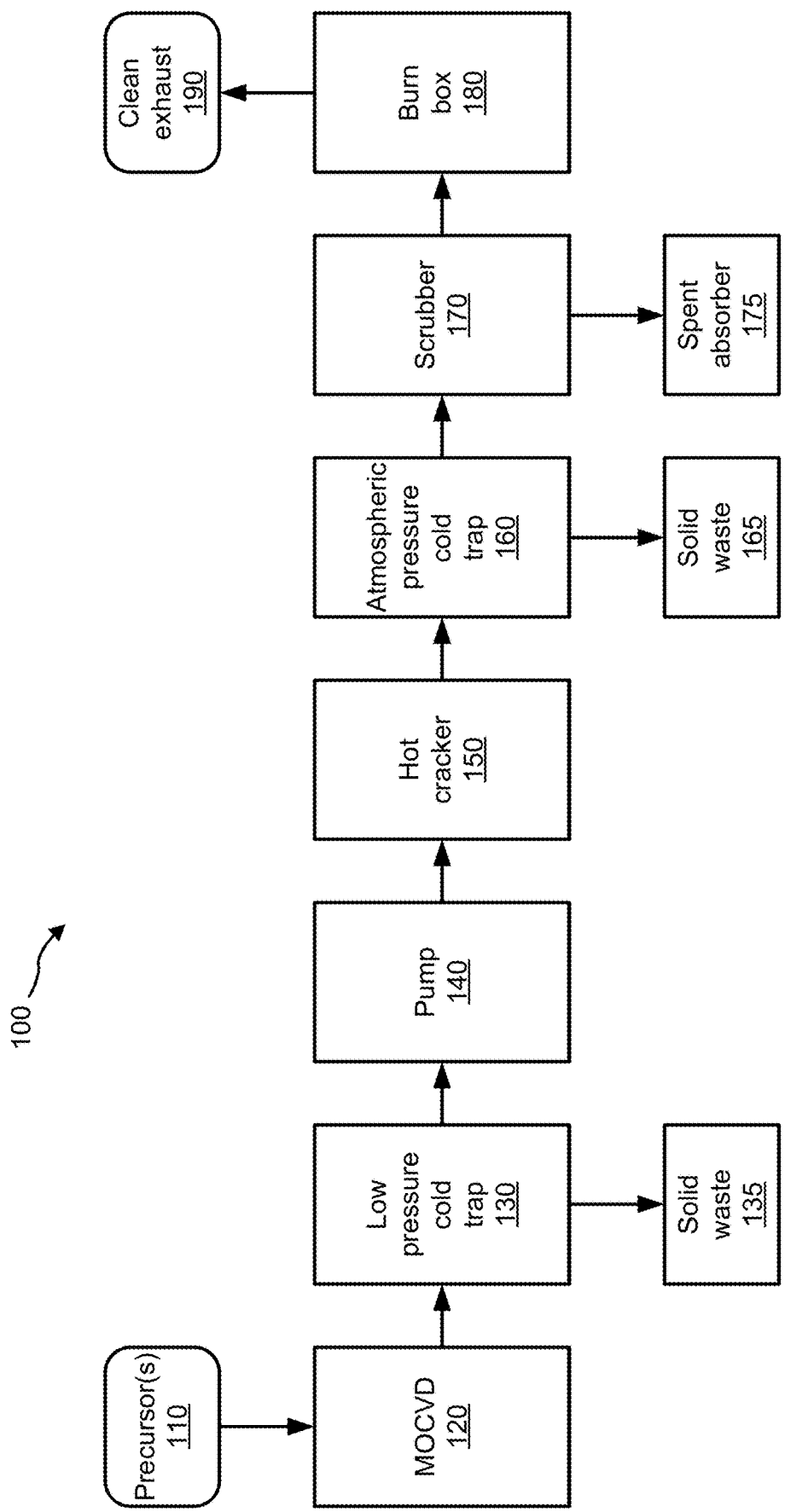
FIG. 1 illustrates an example of a metal-organic chemical vapor deposition (MOCVD) exhaust abatement processing system, according to aspects of the present disclosure.

Referring to FIG. 1, a diagram describing an example of an MOCVD exhaust abatement processing system 100 (or effluent abatement system). While this system is suitable for processing the exhaust gas produced by gallium-arsenide (GaAs) metal-organic chemical vapor deposition (MOCVD) operations, it may also be suitable to handle the exhaust gas from other similar operations. In this system, precursor gas(es) 110 are provided to a GaAs MOCVD processing operation, MOCVD 120. The precursor gas(es) can include arsine gas ($AsH_3$), for example. The exhaust stream or exhaust gas that remains after the MOCVD 120 are provided to a low pressure cold trap 130. The exhaust stream can include a mixture of vapor and gas species. The low pressure cold trap 130 operates at a pressure level that is lower than an atmospheric pressure level of an atmospheric pressure cold trap 160 further downstream in the system. The low press pressure cold trap 130 is configured to condense and/or separate some of the toxic materials (e.g., arsenic forms) in the exhaust stream or exhaust gas. The condensed and/or separated material is stored as solid waste 135 for easy removal or cleaning. The low pressure cold trap 130 is configured to maximize the holding capacity of toxic material that it can collect and store, and to simplify the process of removing the toxic material that is collected.

The exhaust stream or exhaust gas that comes out of the low pressure cold trap 130 has fewer toxic materials to help protect a pump 140, which in turn is used to increase the pressure level of the exhaust stream to that of the atmospheric pressure cold trap 160.

The output of the pump 140, which still contains a mixture of toxic gas and vapors, is provided to a hot cracker 150 that cracks the residual precursors in the exhaust stream before the exhaust stream is provided to the atmospheric pressure cold trap 160 to condense and/or separate (e.g., remove) solid toxic materials. That is, the hot cracker 150 is used to decompose the toxic gases into forms that can be more easily condensed in the atmospheric pressure cold trap 160 rather than absorbed in a scrubber. For example, the hot cracker 150 will crack most of the arsine gas into arsenic, which is then turned into solid waste at the atmospheric pressure cold trap 160. Like the low pressure cold trap 130, the atmospheric pressure cold trap 160 is configured to maximize the holding capacity of toxic material that it can collect and store (e.g., solid waste 165), and to simplify the process of removing the toxic material that is collected.

The exhaust stream that is passed from the MOCVD 120 to atmospheric pressure cold trap 160 may be heated between each stage to avoid condensation that may clog or block passage of the exhaust stream.

Following the atmospheric pressure cold trap 160 there is a final cleaning step provided by a scrubber 170 in which an absorber material removes all residual toxic materials. Once the absorber material is full (whether it is a solid absorber or a liquid absorber), any spent absorber material, spent absorber 175, can be removed and replaced.

Finally, a burn box 180 can be used to eliminate all flammable gas such as hydrogen, for example, by burning the gas to remove it from the exhaust stream. The output of the burn box 180 is a clean exhaust 190 that can be released.

In other implementations of the MOCVD exhaust abatement processing system 100 or other effluent abatement systems similar systems may be implemented in which one or more of the elements shown by FIG. 1 are not used and/or one or more of the elements are used in a different order.

Figure 2:
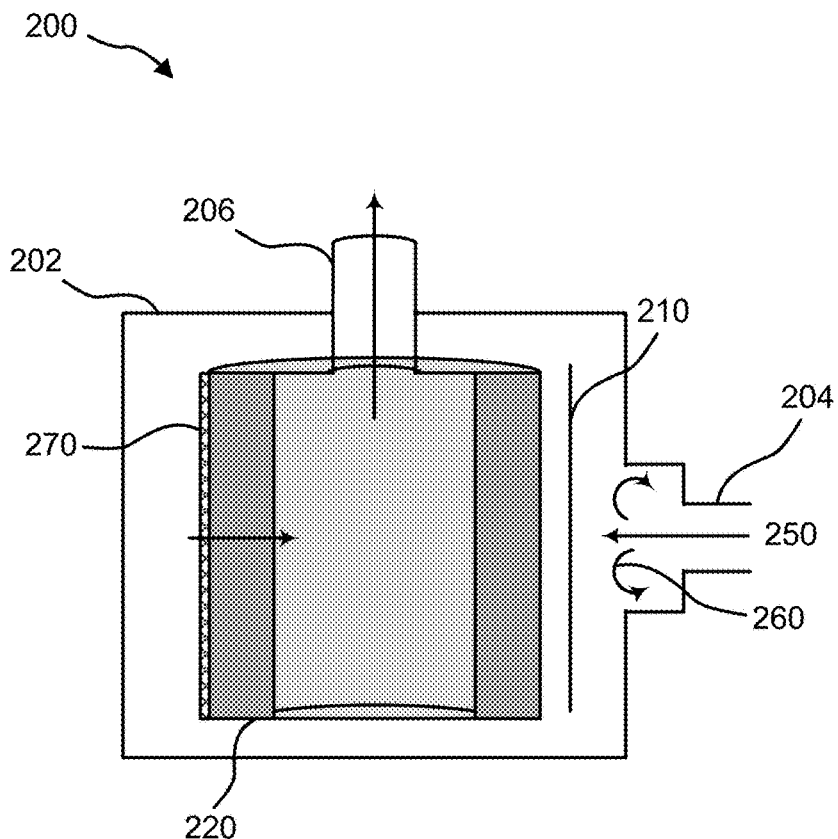
FIG. 2 illustrates an example of a gas trap system of the MOCVD exhaust abatement processing system of FIG. 1, according to aspects of the present disclosure.
Figure 2:
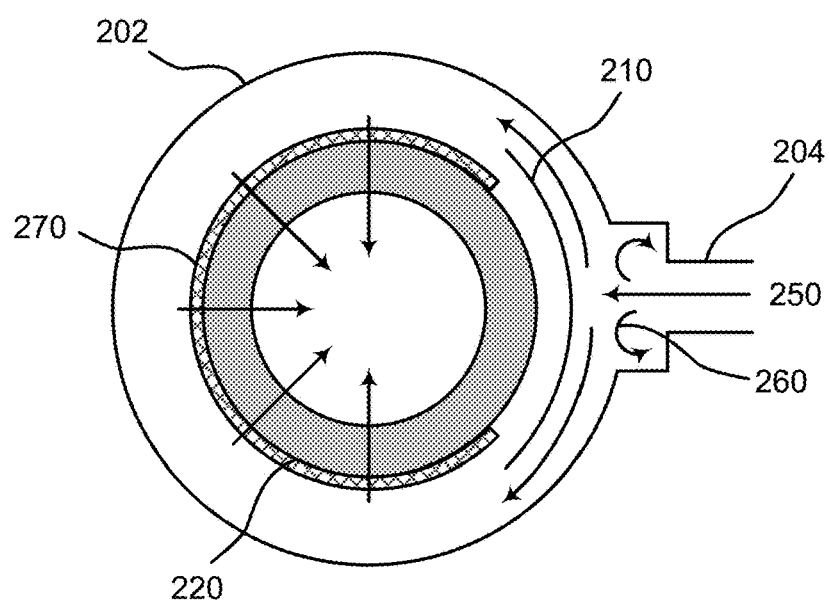

Referring to FIG. 2, different views of an example of a gas trap system 200 are depicted. The gas trap system 200 may be an example of the low pressure cold trap 130 or the atmospheric pressure cold trap 160, as descried herein. In an example, the gas trap system 200 may be configured to cool and filter exhaust gas 250.

The gas trap system 200 may include a body 202 having an inlet 204 to receive the exhaust gas 250 and an outlet 206 to provide the filtered exhaust gas 250 to downstream components. In an example, the exhaust gas 250 enters the body 202 through the inlet 204 and cools in temperature due to a shield 210 thereby preventing damage to a filter 220. After passing the shield 210, the exhaust gas 250 passes through media of the filter 220 and exits the gas trap system 200 via the outlet 206.

As shown by FIG. 2, the flow of the exhaust gas 250 from the inlet 204 towards the shield 210 may cause recirculation 260 as the exhaust gas 250 enters the body 202 of the gas trap system 200. The recirculation 260 may result in particle condensation and agglomeration at the inlet 204 and non-uniform temperature of the exhaust gas 250. Further, the flow of exhaust gas 250 around the shield 210 may result in particle agglomeration 270 along portions of the filter 220 away from the shield 210 thereby resulting in non-uniform utilization (e.g., only 50% or 60% of filter being used) of the filter 220.

Figure 3:
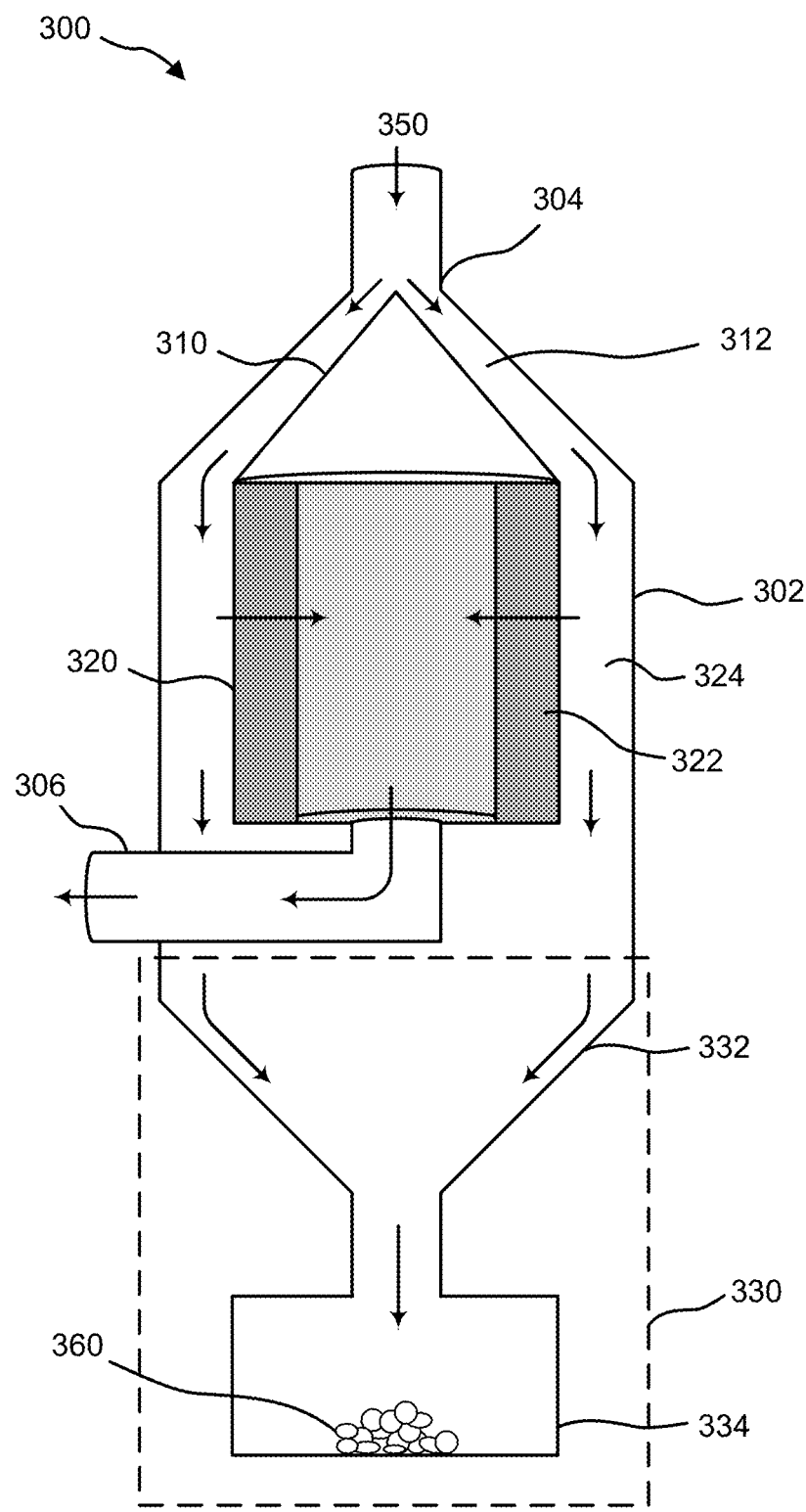
FIG. 3 illustrates another example of a gas trap system of the MOCVD exhaust abatement processing system of FIG. 1, according to aspects of the present disclosure.

Referring to FIG. 3, an example of a gas trap system 300, according to aspects of the present disclosure, is depicted. The gas trap system 300 may be an example of the low pressure cold trap 130 or the atmospheric pressure cold trap 160, as descried herein. Examples of components and configurations of the gas trap system 300 described herein may reference positions of a top of the gas trap system and a bottom of the gas trap system, which are based on a vertical line perpendicular to a surface on Earth (ground).

In an example, the gas trap system 300 may include a housing 302 having an inlet 304 configured to receive exhaust gas 350 from one or more upstream components (e.g., MOCVD 120 or hot cracker 150), and an outlet 306 configured to provide the exhaust gas 350 to one or more downstream components (e.g., pump 140 or scrubber 170). Examples of the inlet 304 and the outlet 306 may include openings in the housing 302 and/or pipes coupled with the housing 302. In an example, the inlet 304 may located at a top surface of the housing 302, and the outlet 306 may be positioned below the inlet 304, as shown by FIG. 3, such that exhaust gas flows from the inlet to the outlet in a top-down path (e.g., path having a direction from the top of the gas trap system 300 towards a bottom of the gas trap system 300).

Arrangement of the inlet 304 being above the outlet 306 may allow gravity to assist in the flow of the exhaust gas 350.

The gas trap system 300 may also include a conical inlet shield 310 positioned within the housing 302. The conical inlet shield 310 may be configured to form a shield path 312 (or first path) between an interior surface of the housing 302 and an exterior surface of the conical inlet shield 310, as shown by FIG. 3. The conical inlet shield 310 may uniformly distribute and uniformly cool the exhaust gas 350 to condense some of the toxic materials (e.g., arsenic forms) in the exhaust gas 350 to particles as the exhaust gas 350 passes through the shield path 312. In an example, as the exhaust gas 350 is uniformly distributed over the conical inlet shield 310, the temperature of the exhaust gas 350 may be reduced by the conical inlet shield 310 causing some of the toxic materials (e.g., arsenic forms) in the exhaust gas 350 to condensate. For example, the exhaust gas 350 may exit the shield path 312 at a temperature (e.g., to 80 degrees Celsius) that is lower than a temperature (e.g. 300 degrees Celsius) that the exhaust gas 350 entered shield path 312.

In an aspect, the gas trap system 300 may also include a filter 320 configured to filter the exhaust gas 350 received from the shield path 312. The filter 320 may be spaced from a surface of the housing 302 to form a filter path 324 (or second path) for receiving the exhaust gas 350, including particles (e.g., exhaust gas condensate) that are sufficiently small to pass through media 322 of the filter 320. The filtered exhaust gas 350 may then exit the filter 320 and the housing via the outlet 306, as shown by FIG. 3.

In an example, the filter 320 may form a cylindrical structure, as shown by FIG. 3. The filter 320 may be positioned such that a first base of the cylindrical structure is close to or in contact with a base of the conical inlet shield 310.

While the filter 320 is illustrated as a single filter, one skilled in the art would understand that the filter 320 may include one or more cylindrical filters. For example, the filter 320 may include a plurality of cylindrical filters having first and second filters concentrically positioned and/or positioned such that exhaust gas 350 may be pass through media of the first filter and then pass through media of the second filter.

In an aspect, the gas trap system 300 may also include a particle collector 330, which is configured to collect particles 360 (e.g., exhaust gas condensate) sufficiently large to not pass through the media 322 of the filter 320. In an example, the particle collector 330 may be removably positioned at a lower portion of the housing 302. In an example, the particle collector 330 may include a funnel region 332 and a collection container 334, wherein the funnel region 332 is positioned below the conical inlet shield 310 and configured to direct the particles 360 towards the collection container 334. In other words, the particle collector 330 may be positioned such that gravity causes the particles 360 to fall from the conical inlet shield 310 and be collected in the collection container 334. In an example, the collection container 334 may be removably coupled with the housing 302 for cleaning. The particles 360 may be examples of the solid waste 135 or 165 described herein.

Figure 4:
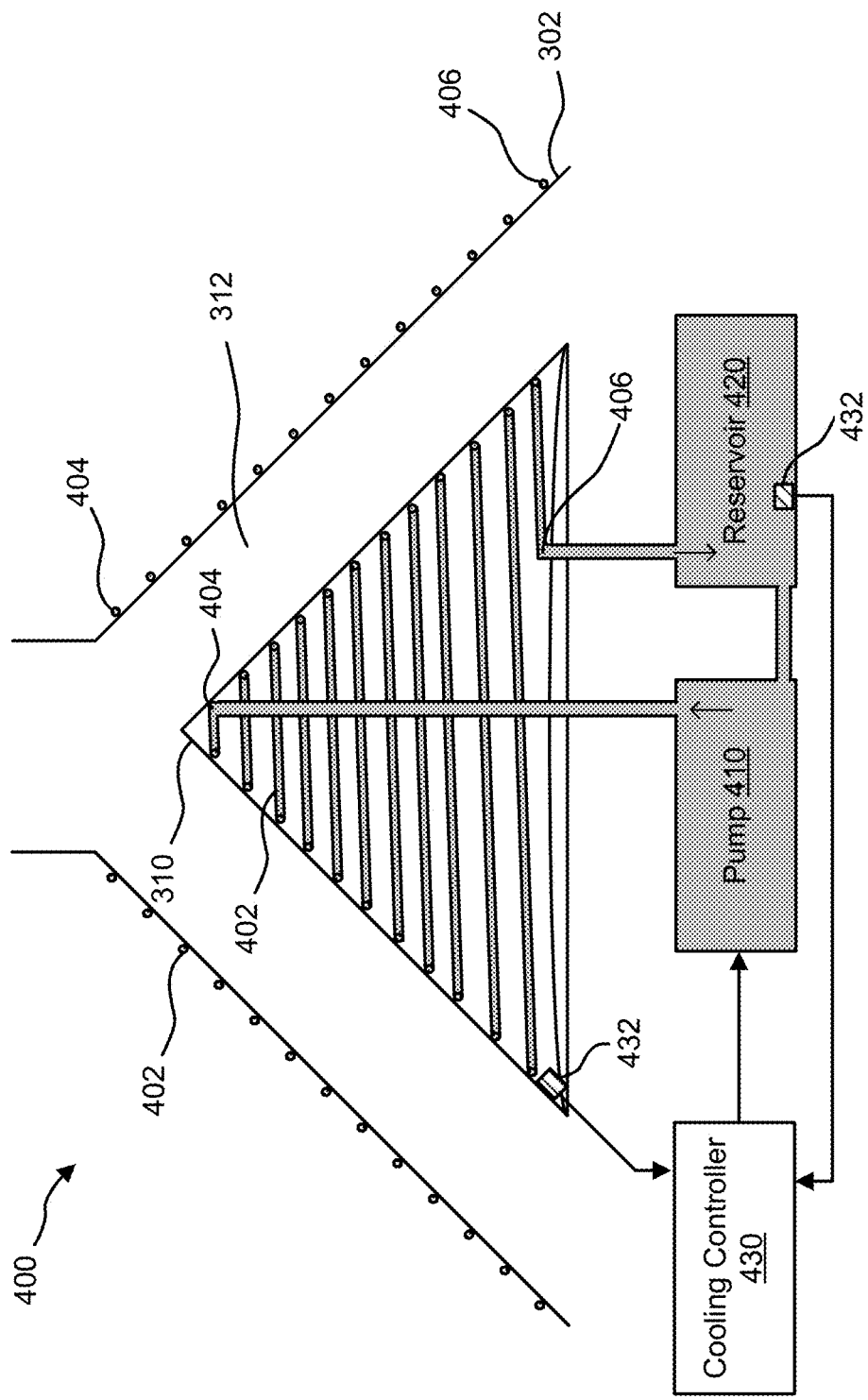
FIG. 4 illustrates an example of cooling system for the gas trap system of FIG. 3, according to aspects of the present disclosure.

Referring to FIG. 4, an example of a shield cooling system 400 is depicted. In an aspect, the shield cooling system 400 may be configured to cool the conical inlet shield 310 thereby cooling the exhaust gas 350 as it passes through the shield path 312. Some or all components of the shield cooling system 400 may be positioned within the conical inlet shield 310.

In an aspect, the shield cooling system 400 may include one or more cooling coils 402 coupled with an interior surface of the conical inlet shield 310 and/or an exterior surface of the housing 302 (i.e., one or more surfaces of the shield path 312). In an example, the one or more cooling coils 402 may wrap around the interior of the conical inlet shield 310 and/or an exterior surface of the housing 302, as shown by FIG. 4, such that coolant circulates to cool the conical inlet shield to cause the condensation of the exhaust gas 350. In an example, the coolant may be provided at an inlet 404 of a respective cooling coil 402 and exit at an outlet 406 of the respective cooling coil 402. For example, the inlet 404 of the respective cooling 402 may be positioned at a top region of the conical inlet shield 310 and/or the housing 302 and the outlet 406 of the respective cooling 402 may be positioned at a bottom region of the conical inlet shield 310 and/or the housing 302, or vice versa.

In an aspect, the shield cooling system 400 may also include a pump 410 configured to circulate the coolant through the one or more cooling coils 402. In an example, the pump 410 may cause the coolant to circulate through the one or more cooling coils 402. For example, the pump 410 may push the coolant to the inlet 404 of the one or more cooling coils 402. The coolant may circulate around the one or more cooling coils 402 until reaching the outlet 406 of the one or more cooling coils 402, and the pump 410 may pull the coolant from the outlet 406. In an example, the coolant may drain into a reservoir 420, from which the pump 410 pulls the coolant.

In an aspect, the shield cooling system 400 may also include a cooling controller 430 configured to control the pump 410 to circulate the coolant through the one or more cooling coils 402. In an example, the cooling controller 430 may connect to one or more temperature sensors 432 configured to determine a temperature of one or more of exhaust gas 350, the conical inlet shield 310, or the coolant. The one or more temperature sensors 432 may provide temperature information corresponding to the conical inlet shield 310 and/or the coolant to the cooling controller 430, and the cooling controller 430 may control a rate of flow of the coolant by controlling (e.g., enabling, disabling, or increasing/decreasing flow rate) the pump 410 based on the temperature information. The cooling controller 430 may be a standalone controller or a part of a controller configured for the gas trap system 300 or the MOCVD processing system 100. In an example, the cooling controller 430 may include one or more processors and/or one or more memories with instructions to coordinate the operations of the shield cooling system 400.

Referring to FIGS. 5A-5H, examples of configurable characteristics of the gas trap system 300 are depicted. One or more of the configurable characteristics may be adjusted to improve or optimize exhaust gas flow, minimize recirculation, and efficiently cool the exhaust gas 350 while passing through the shield path 312 based the gas trap system 300.

Figure 5A:
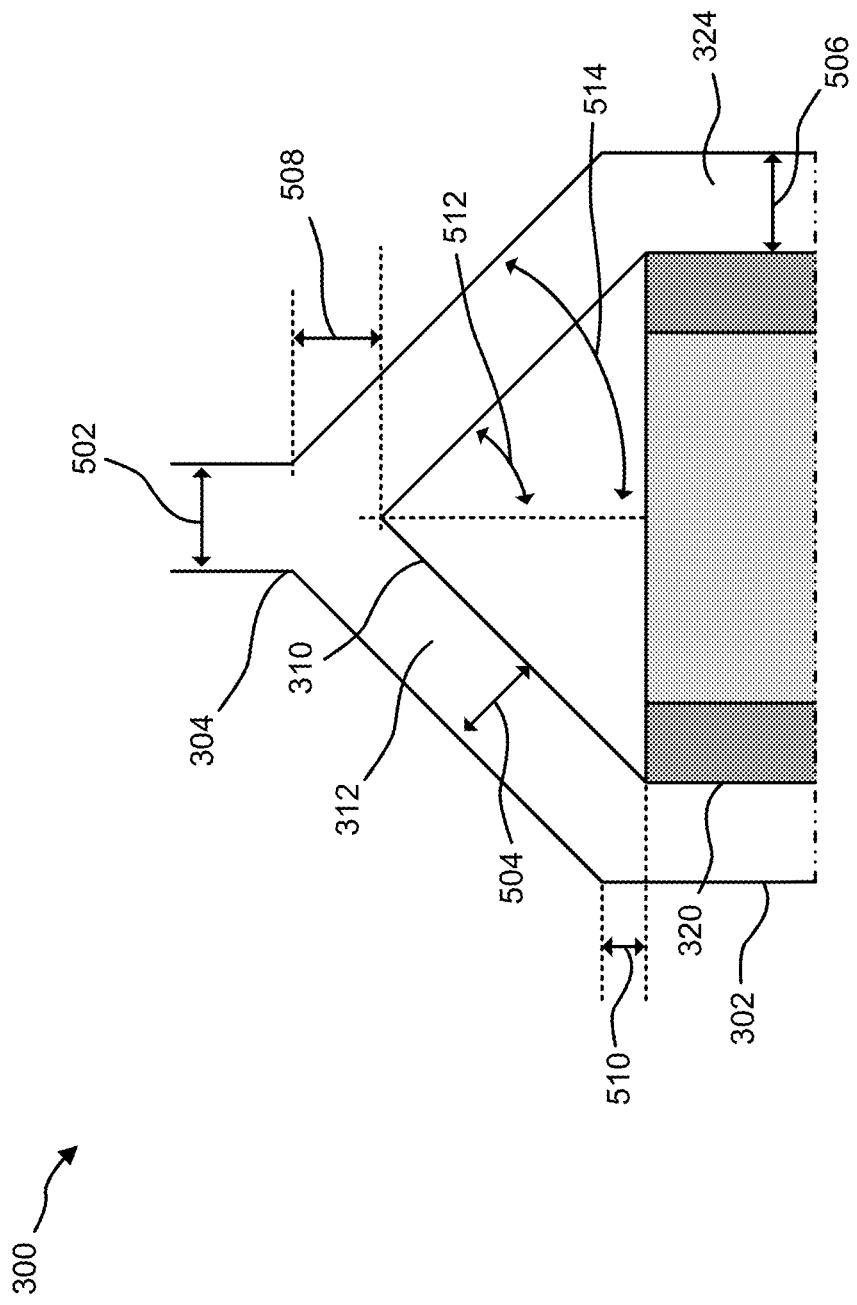
FIGS. 5A-5H illustrate examples of configurable conical region characteristics, according to aspects of the present disclosure.
Figure 5C:
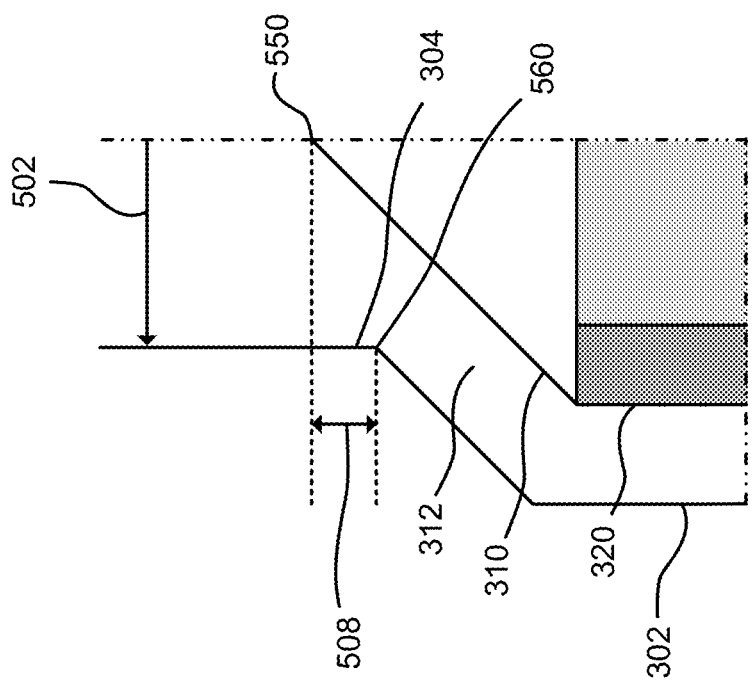
Figure 5B:
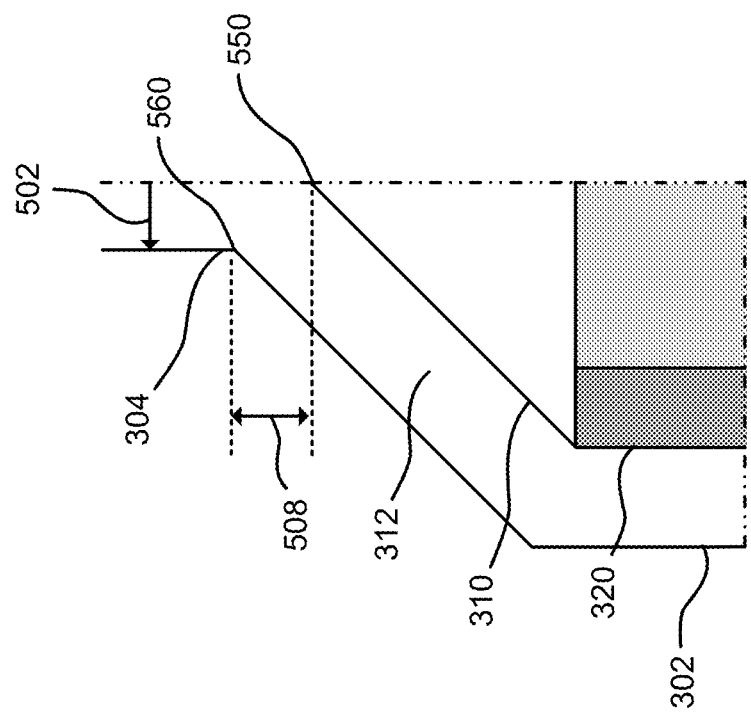
Figure 5E:
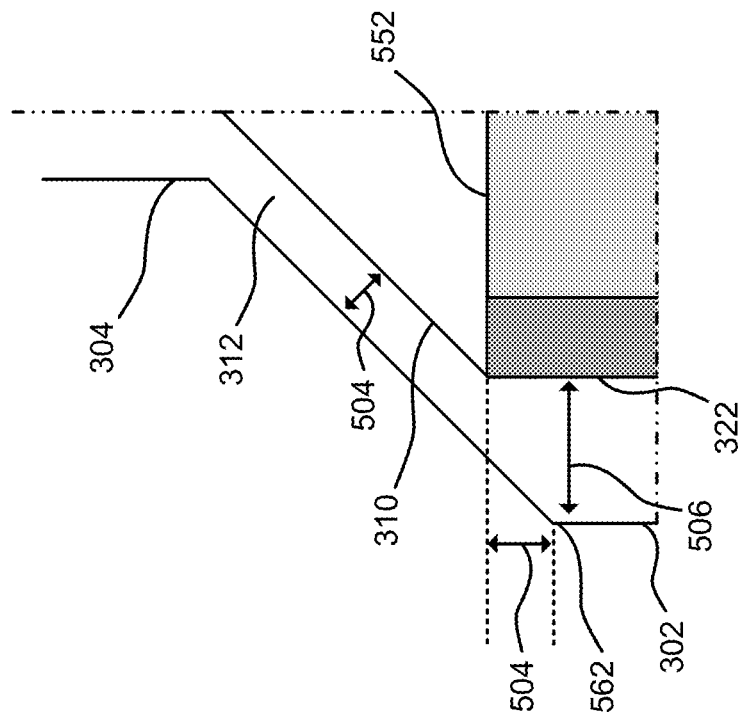
Figure 5D:
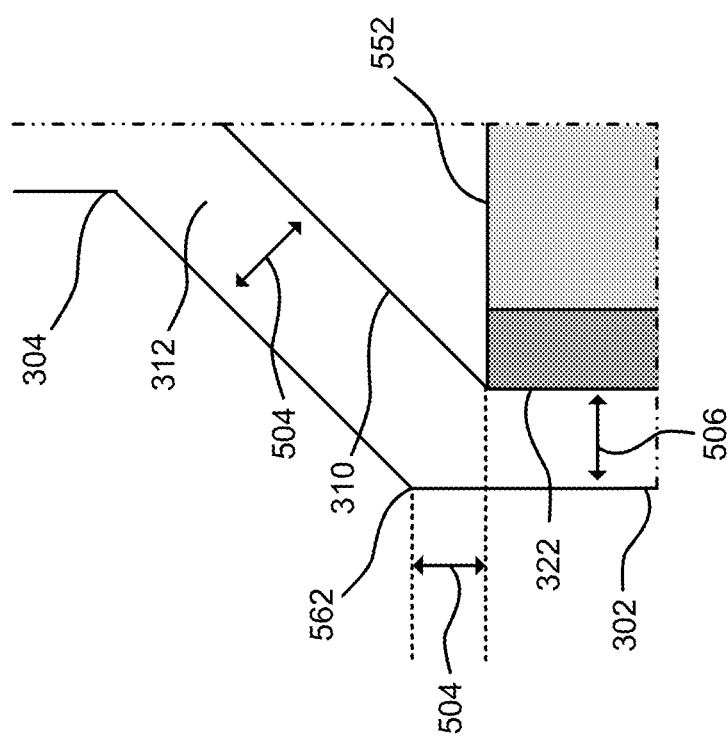

In an example, the configurable characteristics may include adjustments to an inlet size 502 including an inner diameter of one or more of the opening of the housing 302 or the pipe coupled to the housing 302, as shown by FIGS. 5B and 5C. The configurable characteristics may also include adjustments to a shield path size 504, which may include adjustment of a distance between a surface of the housing 302 and the conical inlet shield 310, as shown by FIGS. 5D and 5E. The configurable characteristics may also include adjustment to a filter path size 506 including a distance between a surface of the housing 302 and the filter 322, as shown by FIGS. 5D and 5E.

The configurable characteristics may also include adjustments to a shield apex offset 508, which may include a distance between an apex 550 of the conical inlet shield 310 and the inlet 304 (or first curved section 560 of the housing 302). The apex 550 of the conical inlet shield 310 may be positioned below the inlet 304, as shown by FIG. 5B, positioned level with the inlet 304 (not shown), or positioned above the inlet 304, as shown by FIG. 5C.

The configurable characteristics may also include adjustments to a shield base offset 510, which may include a distance between a base 552 of the conical inlet shield 310 and a second curved section 562 of the housing 302. The base 552 of the conical inlet shield 310 may be positioned below the second curved section 562 of the housing 302, as shown by FIG. 5D, positioned level with the second curved section 562 (not shown), or positioned above the curved section 562, as shown by FIG. 5E.

Figure 5G:
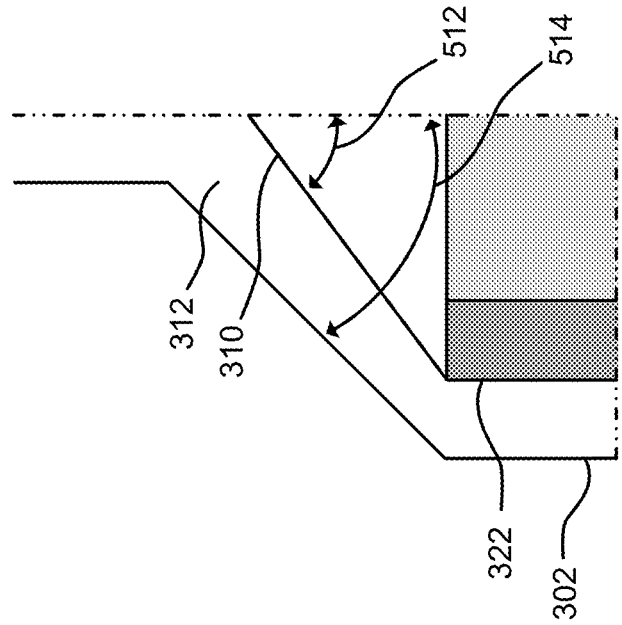
Figure 5F:
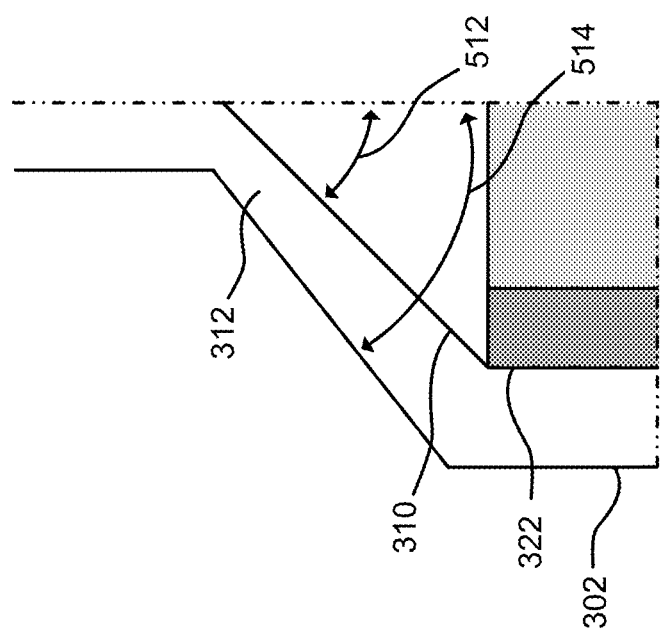

The configurable characteristics may also include adjustments to a shield angle 512 and/or a housing angle 514. In an example, one or more of the shield angle 512 or the housing angle 514 may be measured from a line perpendicular to the base of the conical inlet shield 310. In an example, the shield angle 512 or the housing angle 514 may be adjusted such that an entrance distance of shield path 312 is less than an exit distance of the shield path 312, as shown by FIG. 5F, is the same as the exit distance of the shield path 312, as shown by FIG. 5A, or is wider than the exit distance of the shield path 312, as shown by FIG. 5G.

Figure 5H:
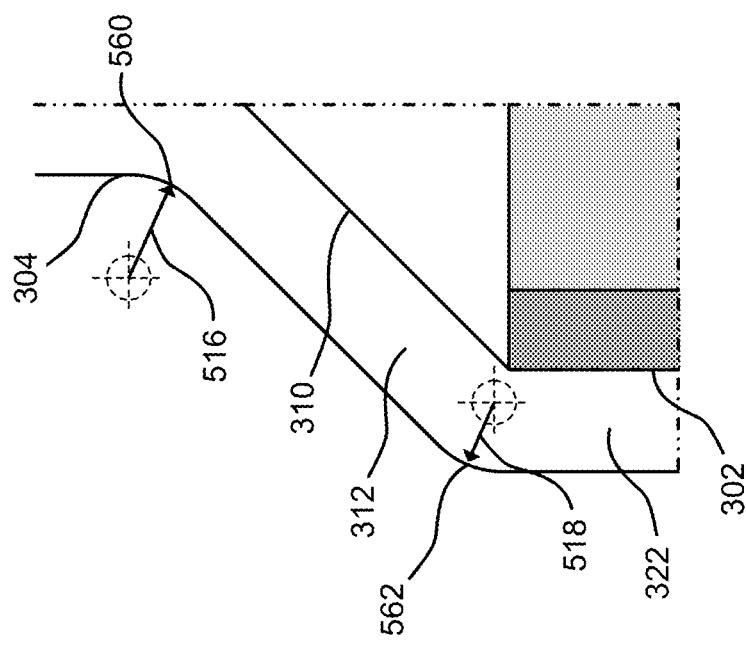

The configurable characteristics may also include adjustment to one or more housing surface radiuses 516, 518, as shown by FIG. 5H. For example, the housing surface radius 516 may provide a smooth curvature at the first curved section 560. In another example, the housing surface radius 518 may provide a smooth curvature at the second curved section 562.

The configured characteristics may be adjusted individually or simultaneously to meet different applications of the gas trap system 300. For example, the inlet size 502 may be configured to a 4 inch diameter, the shield path size 504 may be configured to 0.9 inches, and the shield angle 512 and the housing angle 514 may be configured to 60 degrees, to optimize the gas trap system 300 based on the filter 320 having a diameter of 19.5 inches.

Figure 6:
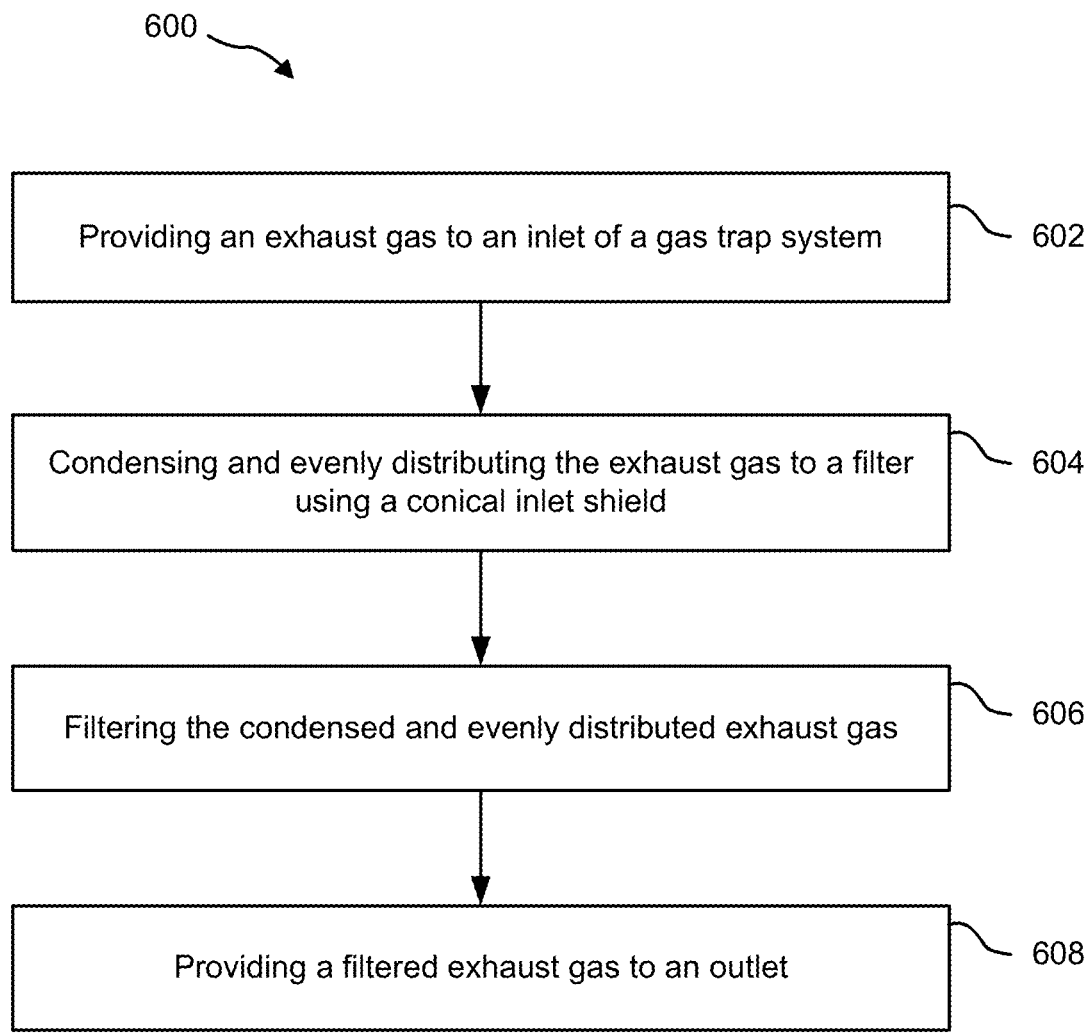
FIG. 6 illustrates a flowchart of an example of a method of exhaust gas abatement processing, according to aspects of the present disclosure.

Referring to FIG. 6, an example of a method 600 for exhaust gas abatement processing, according to aspects of the present disclosure, is depicted. At 602, the method 600 may include providing an exhaust gas to an inlet of a gas trap system. For example, the exhaust gas 350 may be provided to the inlet 304 of the gas trap system 300.

At 604, the method 600 may include condensing and evenly distributing the exhaust gas to a filter using a conical inlet shield. For example, the exhaust gas 350 may be condensed and evenly distributed to the filter 320 using the conical inlet shield 310.

At 606, the method 600 may include filtering the condensed and evenly distributed exhaust gas. For example, the filter 320 may filter the exhaust gas 350 after having passed through the shield path 312.

At 608, the method 600 may include providing a filtered exhaust gas to an outlet. For example, the filtered exhaust gas 350 may be provided to the outlet 306.

It is understood that the specific order or hierarchy of blocks in the processes/flowcharts disclosed is an illustration of exemplary approaches. Based upon different implementations, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more.

Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A gas trap system for metal organic chemical vapor deposition (MOCVD) exhaust abatement operations, comprising:
    a housing including:
        an inlet configured to receive exhaust gas; and
        an outlet;
    a conical inlet shield oriented such that an apex of the conical inlet shield is adjacent to the inlet and positioned within the housing and configured to:
        deflect the exhaust gas around the conical inlet shield and form a first path between the housing and the conical inlet shield, wherein the first path receives the exhaust gas from the inlet,
        cool the exhaust gas, and
        cause the exhaust gas to be uniformly distributed in the first path; and
    a filter configured to receive the exhaust gas from the first path and to filter the exhaust gas, wherein the filtered gas exhaust is provided to the outlet.

2. The gas trap system of claim 1, wherein the exhaust gas flows from the inlet to the outlet in a top-down path.

3. The gas trap system of claim 2, wherein the outlet is positioned below the inlet.

4. The gas trap system of claim 1, further comprising:
a shield cooling system configured to cause the exhaust gas to condense while being uniformly distributed in the first path.

5. The gas trap system of claim 4, wherein the shield cooling system comprises:
one or more cooling coils coupled with a surface of the conical inlet shield and within which a coolant circulates to cool the conical inlet shield to cause the condensation of the exhaust gas.

6. The gas trap system of claim 5, wherein the shield cooling system further comprises:
a pump configured to circulate the coolant through the one or more cooling coils.

7. The gas trap system of claim 6, wherein the shield cooling system further comprises:
a controller configured to control a rate of flow of the coolant by controlling the pump.

8. The gas trap system of claim 7, wherein the shield cooling system further comprises:
one or more temperature sensors configured to provide temperature information corresponding to one or more of the exhaust gas, the conical inlet shield, or the coolant, wherein the controller controls the rate of flow of the coolant based on the temperature information.

9. The gas trap system of claim 1, further comprising a particle collector at a lower portion of the housing and configured to receive particles having a size greater than filtered particles.

10. The gas trap system of claim 9, wherein the particle collector is removably coupled with the housing.

11. The gas trap system of claim 10, wherein the particle collector is vertically positioned below the filter.

12. The gas trap system of claim 1, wherein one or more configurable characteristics of the gas trap system are adjusted to optimize one or more of a flow of the exhaust gas, recirculation, or a temperature of the exhaust gas while passing through the first path.

13. The gas trap system of claim 12, wherein the one or more configurable characteristics include an internal width of the inlet, a distance between a first surface of the conical inlet shield and a surface of the housing, or a distance between the filter and a second surface of the conical inlet shield.

14. The gas trap system of claim 12, wherein the one or more configurable characteristics include one or more of a shield apex offset indicating a distance between the apex of the conical inlet shield and the inlet, a shield base offset indicating a distance between a base of the conical inlet shield and a curved portion of the housing, a shield surface angle or a housing surface angle to adjust an entrance width and an exit width of the first path, or one or more housing surface radiuses to adjust a curvature of one or more curved sections of a surface of the housing.

15. The gas trap system of claim 1, wherein the filter includes a plurality of filters.

16. A metal-organic chemical vapor deposition (MOCVD) exhaust abatement processing system, comprising:
one or more gas trap systems each comprising:
a housing including:
an inlet configured to receive exhaust gas from one or more upstream components; and
an outlet configured to provide the exhaust gas to one or more downstream components;
a conical inlet shield oriented such that an apex of the conical inlet shield is adjacent to the inlet and positioned within the housing and configured to:
deflect the exhaust gas around the conical inlet shield and form a first path between the housing and the conical inlet shield, wherein the first path receives the exhaust gas from the inlet,
cool the exhaust gas, and
cause the exhaust gas to be uniformly distributed in the first path; and
a filter configured to receive the exhaust gas from the first path and to filter the exhaust gas, wherein the filtered gas exhaust is provided to the outlet.

17. The MOCVD exhaust abatement processing system of claim 16, wherein at least one gas trap system further comprises:
a shield cooling system configured to cause the exhaust gas to condense while being uniformly distributed in the first path.

18. The MOCVD exhaust abatement processing system of claim 17, wherein the shield cooling system comprises:
one or more cooling coils coupled with one or more of a surface of the conical inlet shield or a surface of the housing and within which a coolant circulates to cool the conical inlet shield to cause the condensation of the exhaust gas.

19. The MOCVD exhaust abatement processing system of claim 16, wherein at least one gas trap system further comprises a particle collector at a lower portion of the housing and configured to receive particles having a size greater than filtered particles.

20. The MOCVD exhaust abatement processing system of claim 19, wherein the particle collector is removably coupled with the housing.

* * * * *